United States Patent
Hall et al.

(10) Patent No.: US 6,653,158 B2
(45) Date of Patent: Nov. 25, 2003

(54) DOUBLE INTRACAVITY CONTACTED LONG-WAVELENGTH VCSELS AND METHOD OF FABRICATING SAME

(75) Inventors: Eric M. Hall, Santa Barbara, CA (US); Shigeru M. Nakagawa, Goleta, CA (US); Larry A. Coldren, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 16 days.

(21) Appl. No.: 09/935,009

(22) Filed: Aug. 21, 2001

(65) Prior Publication Data

US 2002/0025589 A1 Feb. 28, 2002

Related U.S. Application Data

(60) Provisional application No. 60/262,541, filed on Jan. 16, 2001, provisional application No. 60/227,165, filed on Aug. 22, 2000, provisional application No. 60/227,161, filed on Aug. 22, 2000, and provisional application No. 60/226,866, filed on Aug. 22, 2000.

(51) Int. Cl.$^7$ .............................................. H01L 21/00
(52) U.S. Cl. .......................... 438/22; 438/24; 438/36; 438/37; 438/46; 438/47
(58) Field of Search ............................. 257/81, 84, 88, 257/92, 93, 98, 79, 100, 690, 698, 700; 372/43–44, 50, 90

(56) References Cited

U.S. PATENT DOCUMENTS

| | | | |
|---|---|---|---|
| 4,829,347 A | | 5/1989 | Cheng et al. |
| 5,045,499 A | | 9/1991 | Nishizawa et al. |
| 5,082,799 A | | 1/1992 | Holmstrom et al. |
| 5,168,071 A | * | 12/1992 | Fullowan et al. ............. 437/31 |
| 5,245,622 A | * | 9/1993 | Jewell et al. ................. 372/45 |
| 5,251,225 A | | 10/1993 | Eglash et al. |
| 5,293,392 A | | 3/1994 | Shieh et al. |
| 5,343,487 A | | 8/1994 | Scott et al. |
| 5,358,880 A | | 10/1994 | Lebby et al. |
| 5,392,307 A | | 2/1995 | Sugiyama et al. |
| 5,416,044 A | | 5/1995 | Chino et al. |
| 5,422,901 A | | 6/1995 | Lebby et al. |
| 5,468,343 A | | 11/1995 | Kitano |
| 5,568,504 A | | 10/1996 | Köck et al. |
| 5,588,995 A | | 12/1996 | Sheldon |
| 5,624,529 A | * | 4/1997 | Shul et al. .................. 438/718 |
| 5,631,472 A | | 5/1997 | Cunningham et al. |
| 5,693,180 A | | 12/1997 | Furukawa et al. |
| 5,719,891 A | | 2/1998 | Jewell |
| 5,724,374 A | * | 3/1998 | Jewell et al. .................. 372/45 |
| 5,877,038 A | | 3/1999 | Coldren et al. |
| 5,974,073 A | | 10/1999 | Cannard et al. |
| 5,985,683 A | | 11/1999 | Jewell |
| 5,991,326 A | | 11/1999 | Yuen et al. |
| 6,021,147 A | | 2/2000 | Jiang et al. |
| 6,057,560 A | | 5/2000 | Uchida |
| 6,061,380 A | | 5/2000 | Jiang et al. |
| 6,127,200 A | | 10/2000 | Ohiso et al. |
| 6,207,973 B1 | | 3/2001 | Sato et al. |

FOREIGN PATENT DOCUMENTS

JP          57026492 A       2/1982

OTHER PUBLICATIONS

"Silicon Processing for the VLSI Era, vol. I" by S. Wolf, 1986, Lattice Press, p. 562.*

(List continued on next page.)

*Primary Examiner*—Long Pham
*Assistant Examiner*—Wai-Sing Louie
(74) *Attorney, Agent, or Firm*—Charles Berman; Claude Nassif; Greenberg Traurig LLP

(57) ABSTRACT

A vertical cavity surface emitting laser (VCSEL) includes a semiconductor device having a pair of mirror portions, an active region, a tunnel junction, a pair of cladding layers and a substrate. Heat generated by the VCSEL dissipates through the cladding layers, which utilize an indium phosphide material. The VCSEL also includes selective etches that are used to aperture the active region to allow electric current to be injected into the active region.

55 Claims, 10 Drawing Sheets

OTHER PUBLICATIONS

K.A. Black et al., "Double-fused 1.5 µm vertical cavity lasers with record high $T_o$ of 132K at room temperature" *Electronics Letters*, vol. 34, pp. 1947–1949 (1998).

V. Jayaraman et al., "Uniform threshold current, continuous-wave, singlemode 1300nm vertical cavity lasers for 0 to 70° C.," *Electronics Letters*, vol. 34, pp. 1405–1407 (1998).

M. Ortsiefer et al, "Submilliamp long-wavelength InP-based vertical-cavity surface-emitting laser with stable linear polarization," *Electronics Letters*, vol. 36, pp. 1124–1126 (2000).

W. Yuen et al., "High-performance 1.6µm single-epitaxy top-emitting VCSEL," *Electronics Letters*, vol. 36, pp. 1121–1123 (2000).

O. Blum et al., "Electrical and optical characteristics of AlAsSb/GaAsSb distributed Bragg reflectors for surface emitting lasers," *Appl. Phys. Lett.*, vol. 67, pp. 3233–3235 (1995).

O. Blum et al, "Highly reflective, long wavelength AlAsSb/GaAsSb distributed Bragg reflector grown by molecular beam epitaxy on InP substrates," *Appl. Phys. Lett.*, vol. 66, pp. 329–331 (1995).

J. Boucart et al., "1–mW CW–RT Monolithic VCSEL at 1.55 µm," *IEEE Photonics Technology Letters*, vol. 11, pp. 629–631 (1999).

T. Uchida et al, "CBE Grown 1.5 µm GaInAsP–InP Surface Emitting Lasers," *IEEE Journal of Quantum Electronics*, vol. 29, pp. 1975–1980 (1993).

M.G. Peters et al., "Band–gap engineered digital alloy interfaces for lower resistance vertical–cavity surface–emitting lasers," *Appl. Phys. Lett.*, vol. 63, pp. 3411–3413 (1993).

E. Hall et al., "Electrically–pumped, single–epitaxial VCSELs at 1.55 µm with Sb–based mirrors," *Electronics Letters*, vol. 35, pp. 1–2 (1999).

G. Almuneau, et al., "Improved electrical and thermal properties of InP–AlGaAsSb Bragg mirrors for long–wavelength vertical–cavity lasers," *IEEE Photonics Technology Letters*, vol. 12, pp. 1322–1324 (2000).

E. Hall et al, "Selectively Etched Undercut Apertures in AlAsSb–Based VCSELs," submitted to *IEEE Photonics Technology Letters*, vol. 13, pp. 97–99 (2001).

G. Almuneau et al., "Molecular beam epitaxial growth of monolithic 1.55 µm vertical cavity surface emitting lasers with AlGaAsSb/AlAsSb Bragg mirrors," *Journal of Vacuum Science & Technology B*, vol. 18, pp. 1601–1604 (2000).

J.W. Scott et al, "High Efficiency Submilliamp Vertical Cavity Lasers with Intracavity Contacts," *IEEE Photonics Technology Letters*, vol. 6, pp. 678–680 (1994).

R.N. Naone, and L.A. Coldren, "Tapered Air Apertures for Thermally Robust VCL Structures," *IEEE Photonics Technology Letters*, vol. 11, pp. 1339–1341 (1999).

J.K. Kim et al, "Epitaxially–stacked multiple–active–region 1.55 µm lasers for increased differential efficiency," *Applied Physics Letters*, vol 74, pp. 3251–3253 (1999).

J. Piprek et al., "Minimum temperature sensitivity of 1.55 µm vertical–cavity lasers at—30 nm gain offset," *Applied Physics Letters*, vol. 72, pp. 1814–1816 (1998).

E. Hall et al., "Increased Lateral Oxidation Rates of AlInAs on InP using Short–Period Superlattices," *Electronic Materials Conference, Journ. Electron. Materials*, vol. 29, No. 9, pp. 1100–1104 (2000).

E.R. Hegblom et al., "Small efficient vertical cavity lasers with tapered oxide apertures," *Electronic Letters*, vol. 34, pp. 895–896 (1998).

G. Almuneau et al., "Accurate control of Sb composition in AlGaAsSb alloys on InP substrates by mo l ecular beam epitaxy," *Journal of Crystal Growth*, vol. 208, pp. 113–116 (1999).

J.K. Kim, et al., "Room–temperature, electrically–pumped multiple–active–region VCSELs with high differential efficiency at 1.55 µm," *Electronics Letters*, vol. 35, pp. 1084–1085, No. 13, pp. 1–2 (1999).

M. Sugimoto, et al., "Surface emitting devices with distributed Bragg reflectors grown by highly precise molecular beam epitaxy," *Journal of Crystal Growth*, vol. 127, pp. 1–4, (1993).

M. Yano, et al., "Time–resolved reflection high energy electron diffraction analysis for atomic layer depositions of GaSb by molecular beam epitaxy," *Journal of Crystal Growth*, vol. 146, pp. 349–353 (1995).

C. Starck, "Long Wavelength VCSEL with Tunnel Junction and Metamorphic A 1 As/GaAs Conductive DBR", LEOS '99: IEEE Lasers and Electro–Optics Society 1999 $12^{th}$ Annual Meeting, Nov. 1999, vol. 1, pp. 139–140, especially Figure 1.

K.D. Choquette et al., "Room Temperature Continuous Wave InGaAsN Quantum Well Vertical–Cavity Lasers Emitting at 1.3 µm", Electronics Letters, Aug. 3, 2000, vol. 36 No. 16, pp. 1388–1390.

* cited by examiner

|  | THERMAL CONDUCTIVITY [W/K-CM] | MOBILITY [CM²/V-s] | |
| --- | --- | --- | --- |
|  |  | ELECTRON | HOLE |
| InP | 0.68 | 4600 | 150 |
| AlAsSb | 0.04 | 80 |  |
| AlGaAsSb | 0.03 | 700 |  |
| GaAs | 0.45 | 8500 | 400 |

DOUBLE INTRACAVITY CONTACTED LONG-WAVELENGTH VCSELS AND METHOD OF FABRICATING SAME

The contents of this application are related to those provisional applications having Ser. Nos. 60/227,165, 60/227,161, and 60/226,866, filed Aug. 22, 2000, and a provisional application having Ser. No. 60/262,541, filed Jan. 16, 2001. The present application claims priority to these related provisional patent applications and their contents are hereby incorporated by reference in their entirety into the present disclosure. The contents of this application are also related to several nonprovisional patent applications being filed concurrently herewith. These nonprovisional patent applications are hereby incorporated by reference in their entirety.

This invention was made with the support of the United States Government under Grant No. MDA972-98-1-0001, awarded by the Department of Defense (DARPA). The Government has certain rights in this invention under 35 U.S.C. §202.

BACKGROUND OF THE INVENTION

1. Field of the Invention

The invention relates in general to a vertical cavity surface emitting laser (VCSEL). More particularly, the invention relates to double-intracavity contacted long-wavelength vertical cavity lasers.

2. General Background and State of the Art

Semiconductor lasers are widely used in optical applications, in part because semiconductor fabrication techniques are relatively inexpensive and yield reliable, consistent results. Also, they are easily packaged into current microelectronics. A relatively new class of semiconductor lasers, vertical cavity surface emitting lasers (VCSELs), has been developed through the evolution of this technology. Unlike conventional edge emitting lasers that emit light in a direction parallel to the semiconductor substrates where the lasers are formed, VCSELs have optical cavities perpendicular to the substrate, and thus emit optical radiation in a direction perpendicular to the substrate and perpendicular to a p-n junction formed between layers grown on the substrate. In addition to various performance and application-adaptable improvements created thereby, VCSELs simply require reduced complexity in their fabrication and testing, as compared to conventional edge emitting semiconductor lasers.

Vertical cavity surface emitting lasers (VCSELs) have been proven to be solutions for low-cost transmitters for high-speed data communications at 980 nm and 850 nm and have shown great potential for cost-effective telecommunication systems at longer wavelengths as well, such as 1.55 $\mu$m and 1.3 $\mu$m. These long wavelength VCSELs will satisfy increasing demand for high speed data transmission over tens of kilometers. 10-Gigabit Ethernet is one example, which requires inexpensive transmitters with a data rate of 10G bit per second (Gbps) and up to 40 km reach over single-mode fiber.

VCSELs are semiconductor lasers having a semiconductor layer of optically active material, such as gallium arsenide or indium gallium arsenide or the like, sandwiched between highly-reflective layers of metallic material, dielectric material, epitaxially-grown semiconductor dielectric material or combinations thereof, most frequently in stacks. As is conventional, one of the mirror stacks is partially reflective so as to pass a portion of the coherent light built up in the resonating cavity formed by the mirror stack/active layer sandwich. Laser structures require optical confinement and carrier confinement to achieve efficient conversion of pumping electrons to stimulated photons (a semiconductor may lase if it achieves population inversion in the energy bands of the active material.)

While both short wavelength and long wavelength VCSELs have proven to offer excellent solutions for many applications in the evolving optical applications marketplace, they also have certain limitations and drawbacks that are well known in the art. Some of the drawbacks are associated with the need to electrically pump as well as conduct heat through the multi-layer mirror stacks, which exhibit poor electrical and thermal conductivities. Other drawbacks to VCSEL performance include high threshold current and high operating voltage. Mirror stacks lattice-matched to InP, as desired for high-reliability long wavelength operation, have limited thermal conductivity, and if doped sufficiently to provide useful electrical conductivity, also create excessive optical loss.

INVENTION SUMMARY

The present invention provides a novel approach to overcoming the drawbacks of existing VCSELs by presenting a double intracavity contacted VCSEL having a selectively apertured active region. The present invention provides a new design and method of manufacture allowing for room temperature, continuous-wave (CW) operation of AsSb-based VCSELs by providing thick indium phosphide (InP) cladding layers having very thin heavily-doped contact layers in a double-intracavity structure.

The present invention has several features combined together resulting in improved thermal characteristics as well as reduced current and optical losses. These combined features include:

1. thick n-type cladding layers;
2. very thin, heavily-doped, n-typed contact layers and a very thin, heavily-doped, tunnel junction; and
4. an aperture formed from the active region.

The thick, n-type cladding layers provide low-impedance current and heat paths avoiding conduction through poor optically and electrically conducting distributed Bragg reflectors, also known as DBRs or Bragg mirrors. The low-impedance heat path reduces the device temperature. The low-impedance current path results in a lower device operating voltage which also reduces the device temperature. Because the current path is through the cladding layers, there is no need to dope the DBRs and substrate, resulting in reduced free carrier absorption and reduced optical loss. Optical loss is also decreased because the cladding layers are n-type rather than p-type.

The very thin, heavily-doped n-type contact layers lower the impedance of the current path by providing better electrical contact with attached contacts. The heavily-doped tunnel junction provides a hole source allowing both cladding layers to be substantially n-type, reducing optical loss and decreasing impedance. The heavily-doped contact layers are thin, reducing optical loss since the majority of the contact layer volume can be doped at a lower level. Additionally, the heavily-doped contact layers are located at standing-wave nulls in the laser cavity, reducing free carrier absorption. Selective etchings enable the exposure of such thin, heavily doped, contact and tunnel junction layers.

The aperture formed in the active region confines the current to the desired area of the active region, reducing the device voltage. The optical mode is also confined, reducing optical loss and lowering the threshold current. The optical mode is confined by the aperture, resulting in reduced optical loss at the sidewall of the etched-pillar DBR, lower threshold current, lower threshold current density, larger differential quantum efficiency and higher output power.

The method of increasing the processing efficiency of a VCSEL also includes removing a first, or top, DBR by applying a first selective etch, removing a first, or top, cladding layer by applying a second selective etch, and removing the active region by applying a third selective etch to form an undercut aperture in the active region into which electric current can be confined. Additionally, the present invention further provides the first room temperature, continuous-wave (CW) operation of a 1.55-$\mu$m vertical-cavity surface-emitting laser (VCSEL) that is completely lattice-matched to InP and produced in one epitaxial growth.

Accordingly, it is one object of the present invention to provide for room temperature, continuous-wave (CW) operation of AsSb-based VCSELs by including indium phosphide (InP) cladding layers having very thin heavily-doped contact layers in a double-intracavity structure. It is another object of the invention to provide a method of increasing the processing efficiency of a VCSEL by selectively etching an undercut aperture into the active region and injecting current into the active region.

Another object of the present invention is to provide a room temperature, continuous-wave (CW) operation of a 1.55-$\mu$m vertical-cavity surface-emitting laser (VCSEL) that is completely lattice-matched to InP and produced in one epitaxial growth.

Other objects of the present invention are to reduce elevated temperatures in the VCSEL, minimize optical loss associated with heavily-doped contact layers, reduce threshold current and operating voltage, and improve thermal conductivity and electrical resistivity in the VCSEL.

BRIEF DESCRIPTION OF THE DRAWINGS

FIG. 11($b$) is a plot of thermal impedance vs. aperture diameter for a double intracavity contacted VCSEL with 16 $\mu$m pillar;

FIG. 13($b$) is a plot of light output characteristics of a double intracavity contacted VCSEL with a 10 $\mu$m aperture and 16 $\mu$m (solid) pillar or 12 $\mu$m (dashed) pillar;

DETAILED DESCRIPTION OF THE EMBODIMENTS

Figures 1, 2:
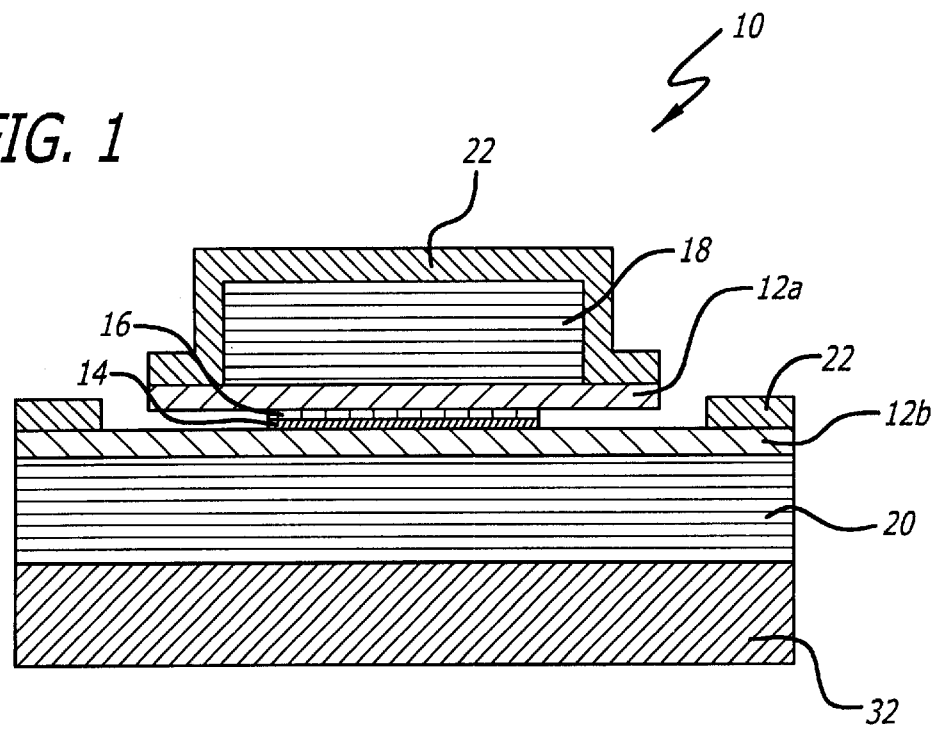
FIG. 1 is schematic representation of double intracavity contacted, long wavelength VCSEL.
FIG. 2 is a table showing thermal conductivity and electron and hole mobility of various materials used in VCSEL design.

FIG. 1 is a schematic representation of a long wavelength VCSEL 10 having two InP layers 12$a$, 12$b$ cladding an InAlGaAs-based active region 14, such that the active region 14 is disposed between the two InP layers 12$a$, 12$b$ to form a double intracavity contacted structure. A tunnel junction 16 located between one of the InP layers 12$a$ and the active region 14 generates holes for quantum wells in the active region 14 and allows both of the InP cladding layers 12$a$, 12$b$ to be n-type. Only the InP cladding layers 12$a$, 12$b$, the tunnel junction 16 and part of the active region 14 are doped. Holes are created by the extraction of electrons from the valence band of a p-type layer in the tunnel junction 16. This design allows for the two n-type cladding layers 14 which have both higher electrical conductivity and lower optical loss than similarly-doped p-type layers. The tunnel junction 16 itself is at a standing-wave null of the cavity mode to minimize the absorption associated with the higher doping at this interface. The VCSEL 10 also includes first and second Sb-based mirror portions 18, 20 (also called a distributed Bragg reflector, or DBR). The contact scheme enables current to be injected through the InP cladding layers 12$a$, 12$b$ and bypass the first and second mirror portions 18, 20, and it eventually reduces series resistance of the VCSEL. The DBRs 18 and 20 are undoped, Sb-based multi-layered structures and may include alternating layers of aluminum arsenic antimonide (AlAsSb) and aluminum gallium arsenic antimonide (AlGaAsSb).

The double intracavity contacted structure also allows heat generated inside the VCSEL 10 to bypass the first and second mirror portions 18 and 20 in the same manner with the injected current, such that most of the heat comes out of the VCSEL 10 through the two InP cladding layers 12$a$, 12$b$ and contacts 22. This provides the VCSEL 10 with low thermal impedance in spite of the fairly low thermal conductivity of the Sb-based DBRs. The high electron mobility and the high thermal conductivity of InP provides low electrical and thermal impedance for the VCSEL 10 and prevents the VCSEL 10 from over-heating. Low electrical and thermal impedance is very useful for VCSELs operating at long wavelengths where a dominant non-radiative recombination process is an Auger recombination, which reduces injection efficiency and increases exponentially with temperature. FIG. 2 is a table detailing the thermal conductivities and electron and hole mobilities of materials in the design of the double intracavity contacted VCSEL 10.

The intracavity contacts allow the VCSEL 10 to utilize undoped DBRs 18 and 20 and an undoped substrate 32, reducing free-carrier absorption in the VCSEL 10. The free-carrier absorption is further reduced by the decreasing doping level of the n-type InP cladding layers 12a, 12b without significant increase of the series resistance due to the high electron mobility of InP. In the double intracavity contacted design, scattering loss at the sidewall of the DBRs must also be minimized. The scattering loss is reduced by employing an undercut etched aperture smaller than the etched pillar formed by the first and second mirror portions 18, 20. An oxide aperture may also be used to provide current as well as optical confinement for shorter-wavelength Ga-based VCSELs. In the double intracavity design, however, an undercut etched aperture is employed instead of an oxide aperture and is formed by selectively etching an InAlGaAs-based active region with a mixture of citric acid and hydrogen peroxide as discussed herein. An advantage of an undercut aperture is that this constrains current exactly into the desired area of the active region, and there is no current spreading between the current aperture and the active region as is seen in oxide apertures. Surface-recombination appears to be low in the 1.55 $\mu$m active regions.

The double intracavity contacted long wavelength VCSEL 10 may be grown in a single step using molecular beam epitaxy in which the whole structure is completely lattice-matched to InP. In one embodiment, the first and second DBRs 18 and 20 use 30.5 periods and 21.5 periods of $Al_{0.15}Ga_{0.85}As_{0.58}Sb_{0.42}/As_{0.56}Sb_{0.44}$, respectively. This material combination has an index contrast of 0.47, which brings a calculated reflectivity of >99.9% for the first DBR 18. The measured transmission of the second DBR 20 is 1.2%. The 1.5$\lambda$-thick InP cladding layers 12a, 12b located on the top and bottom of the active region 14 are both n-type doped $5 \times 10^{17}$ $cm^{-3}$ with silicon (Si), with top surface contact layers 10 nm thick doped $5 \times 10^{18}$ $cm^{-3}$ with Si. InP doped with Si to a level of $5 \times 10^{17}$ $cm^{-3}$ has an absorption coefficient of 2.5 $cm^{-1}$. An n-type layer of the tunnel junction 16 is 20 nm of InP doped $3 \times 10^{19}$ $cm^{-3}$ with Si, and a p-type layer is 20 nm of AlInAs doped $1 \times 10^{20}$ $cm^{-3}$ with carbon (C).

The active region 14 is based on an AlGaInAs material system and includes five strain compensated InAlGaAs quantum wells. This active region 14 has large conduction band offsets and is promising for high temperature operation. With this active region 14, 10 Gbps operation at high temperatures (85° C.) has been demonstrated using an uncooled ridge waveguide laser. The whole cavity including the active region 14 and InP cladding layers 12a, 12b is 3.5$\lambda$ thick. The grown cavity has a resonance wavelength of 1550 nm, the active region 14 has a photo luminescence peak of 1510 nm, and this gain offset puts the threshold minimum around room temperature.

Figure 3:
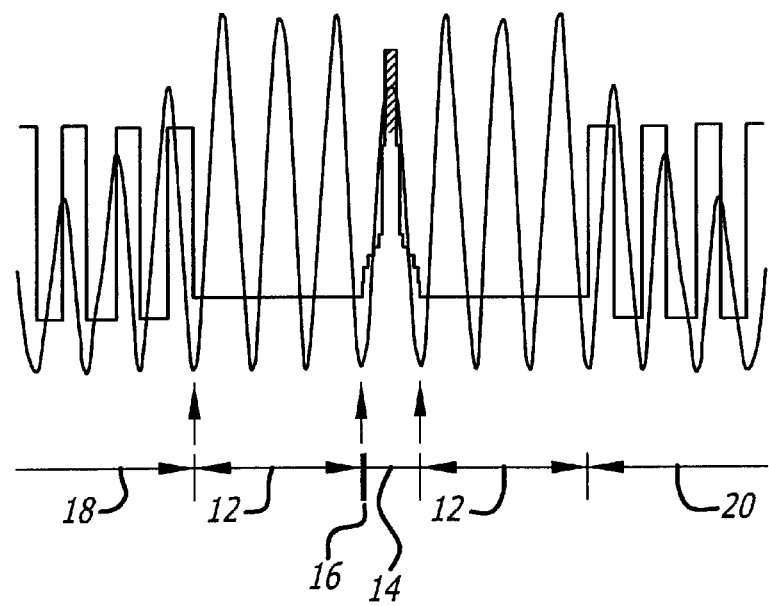
FIG. 3 is a plot of standing wave distribution in a 3.5$\lambda$ cavity of a double intracavity contacted VCSEL.

FIG. 3 is a plot of the standing wave distribution of a VCSEL 10, in which three arrows indicate the positions of heavily-doped layers. All heavily-doped layers, i.e. the InP cladding layers 12a, 12b and tunnel junction 16, are located at standing-wave nulls in the laser cavity, so that free-carrier absorption is reduced as much as possible.

Figure 4:
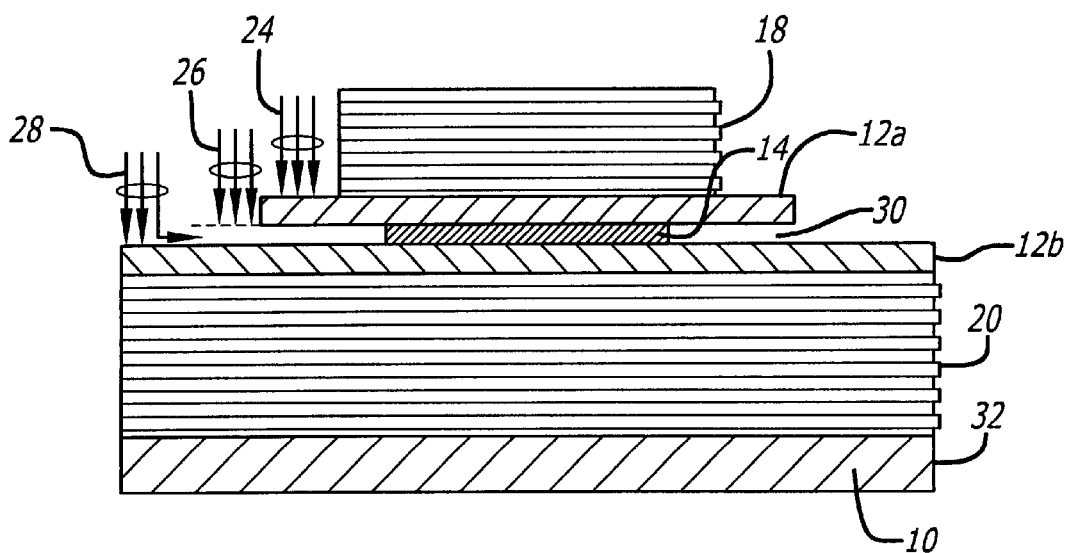
FIG. 4 is a schematic representation of a selective etch process of producing the VCSEL of the present invention.

FIG. 4 is schematic representation of the process of fabricating a double intracavity, long wavelength VCSEL 10. Exposing the InP contact layers 13, 21 of the cladding layers 12a, 12b (see FIG. 16) is one of the most critical steps in the fabrication process of the double intracavity contacted VCSEL. The contact layers 13, 21 must be exposed to allow for current to be injected through contacts 22. To expose the first contact layer, a portion of the top mirror is removed. To expose the second contact layer 21, portions of the cladding layer 12a and active region 14 are then removed. The contacts 22 may be made of metals that include but are not limited to nickel, gold, germanium and/or other conducting materials.

Since the contact layer thickness should be minimized to reduce free carrier absorption in the cavity, the various selective etches are used to control etching depth precisely when the contact layers are exposed. To reach the first InP cladding layer 12a at least a portion of the first mirror portion 18 is removed. For long wavelength VCSELs 10 grown epitaxially on InP, these DBRs 18 are typically AlGaAs, InAlGaP or AlGaAsSb-based. A first selective etch 24 is a low voltage reactive ion etch (RIE) using chlorine ($Cl_2$)gas that etches through either type of DBR 18 but does not etch the InP cladding layer 12a, so that the etching stops at the very top of the cladding layer 12a. This transition is caused by the formation of a non-volatile $InCl_2$ layer on the surface of the contact layer 13 and is easily identified during the RIE using an in-situ laser monitor. Although the selectivity of AlGaAsSb to InP is not so large (around 6:1), the RIE exposes the very thin (10 nm) top contact layer 13 by combining the selective RIE with the in-situ monitoring.

The first etch 24, therefore, stops exactly where the first contact 22 for the double intracavity VCSEL 10 is deposited. The first contact layer 13 is therefore very thin (<100 Å), minimizing the optical loss associated with this layer.

A second InP cladding layer 12b lies below the first InP cladding layer 12a and the active region 14. By choosing a AlInGaAs-based active region, common in long-wavelength lasers, two more selective etches can be employed to reach this second cladding layer 12b without excessive processing difficulty.

A second selective etch 26, which is a RIE which includes methane and hydrogen ($CH_4/H_2$) gases and which is standard for InP etching, removes at least a portion of the first InP cladding layer 12a but stops on the top InAlAs layer of the active region 14. Selectivity of this second selective etch is, in one embodiment, a 16:1 selectivity. In one embodiment, argon (Ar) gas may also be used in combination with methane and hydrogen in the second selective etch 26. In another embodiment, nitrogen ($N_2$) gas may also be used in combination with methane and hydrogen. A third selective etch 28, which includes a mixture of citric acid and hydrogen peroxide, then removes at least a portion of the InAlGaAs active region but does not etch the second contact layer 21 (see FIG. 16) with a selectivity of more than 100:1. In one embodiment, the selectivity of this third etch is 80:1. This InP contact layer of the cladding layer 12b, therefore, can also be confined to the top 100 Å. The third selective etch 28 is also used to undercut the active region to aperture the VCSEL 10.

Figure 5:
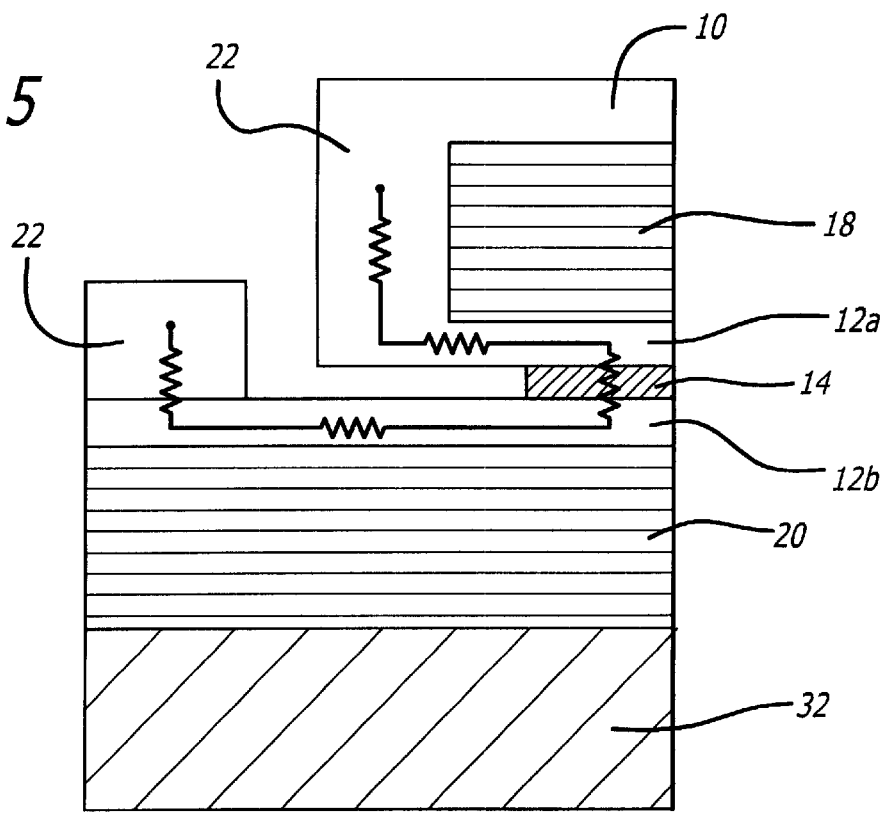
FIG. 5 is a close-up schematic representation of a VCSEL having contacts placed at positions where selective etches have removed portions of the VCSEL structure.
Figure 6:
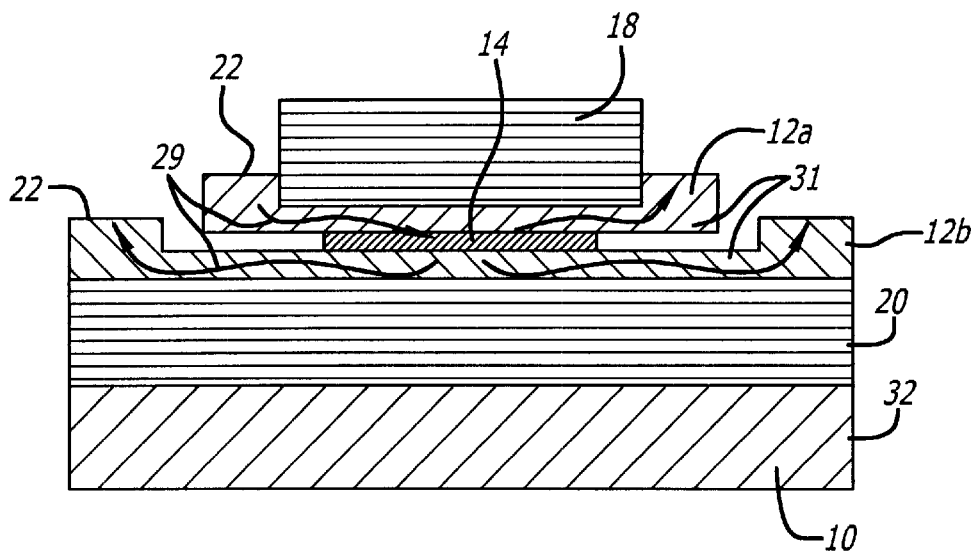
FIG. 6 is a schematic representation of a VCSEL showing the flow of current and heat through contacts and cladding layers.

FIGS. 5 and 6 are schematic representations of VCSELs 10 having contacts 22 placed at positions where the above selective etches have removed portions of the VCSEL structure. FIG. 5 shows a diagrammatic representation of an circuit model in the VCSEL. FIG. 6 shows a diagrammatic representation of a VCSEL 10 having contacts 22. As voltage is applied across the contacts 22, a current path 29 flows through the contacts 22, the InP cladding layers 12a, 12b and the apertured active region 14 such that the current 29 is constrained in the middle of the active region 14 due to the etched away portion at the side of the active region. The heat flows through the heat path 31.

In an alternative embodiment, the cladding layer 12b is not used as an intracavity contact. Rather, the current path extends from the contact 22 of the cladding layer 12a and through the substrate 32. In this embodiment the substrate 32 and mirror 20 should be doped to provide a conductive path. This embodiment maintains some thermal benefits of the cladding layers 12a, 12b and undoped top mirror 18. Advantages of an undoped bottom mirror 20 and undoped substrate 32 along with the bipassing of the current flow away from the mirror 20 are compromised in favor of extra fabrication simplifications. The cladding layer 12b can be kept in the structure to serve as a heat spreading layer even though not used as an intracavity contact. Alternatively, the cladding layer 12b can be removed from the structure to provide further fabrication simplifications.

Figure 7:
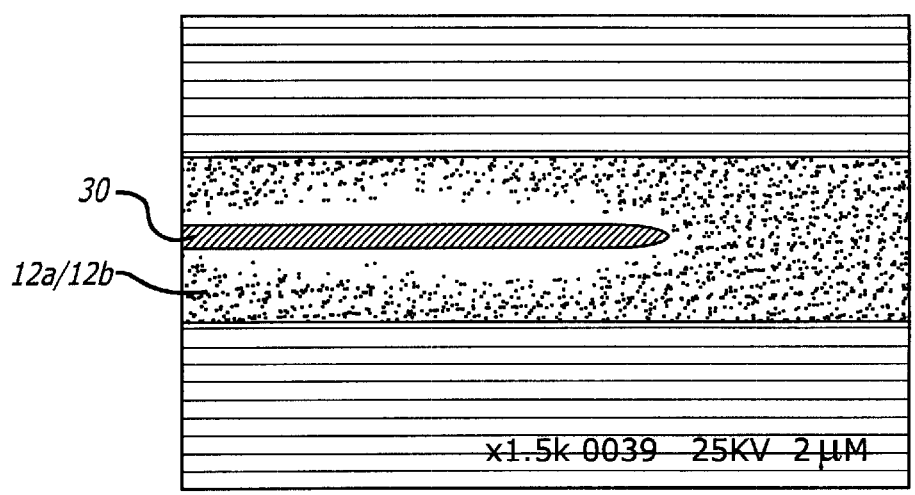
FIG. 7 is a picture of a VCSEL having an undercut aperture formed by selectively etching the active region.

FIG. 7 is a close-up picture of a VCSEL 10 having an etched gap 30. The etched gap 30 creates the undercut aperture having a disk-like shape etched in the active region 14. An undercut aperture 14 is utilized in the VCSEL 10 to constrain injected current into the area underneath the etched-pillar DBR and minimize optical scattering loss at its sidewall. The citric acid-hydrogen peroxide mixture of the third etch 28 selectively etches InAlGaAs and not InP, forming the undercut aperture 30. The selectivity (>100:1) is large enough so that the undercut aperture deeper than 10 $\mu$m can be formed with little decrease of the InP cladding layers 12a, 12b. This third etch 28 also shows selectivity between InAlAs and InGaAs, and it produces a slight tapered aperture as seen in FIG. 7. The etching depth was monitored using circular InP bumps with different diameters which sit on the same wafer with the devices. These InP bumps have an InAlGaAs layer, the same layer as the active region, and this InAlGaAs layer is also etched when the undercut aperture 30 is formed. The undercut depth was determined by checking the diameter of the largest bump which was etched off.

The undercut aperture is formed by selectively etching the active region after the other layers have been etched by other selective etches. The undercut aperture is formed as the third selective etch is applied from the outside of the VCSEL 10 toward the inside of the active region from either side. Thus, an undercut aperture is formed by etching away portions of the active region from the outside and working inward toward the center of the VCSEL structure.

In another embodiment, the VCSEL 10 may be etched beginning with a substrate 32, followed by the bottom mirror portion 20 such that the VCSEL 10 is etched from the bottom up to the active region 14. After etching at least a portion of the substrate 32 and at least a portion of the bottom DBR 20, at least a portion of the bottom cladding layer 12b is then etched to allow access to the active region 14. The active region 14 is then etched by applying the citric acid—hydrogen peroxide third selective etch 28 and aperturing a portion of the active region to allow current 29 to be constrained into the center of the active region 14.

Figure 8:
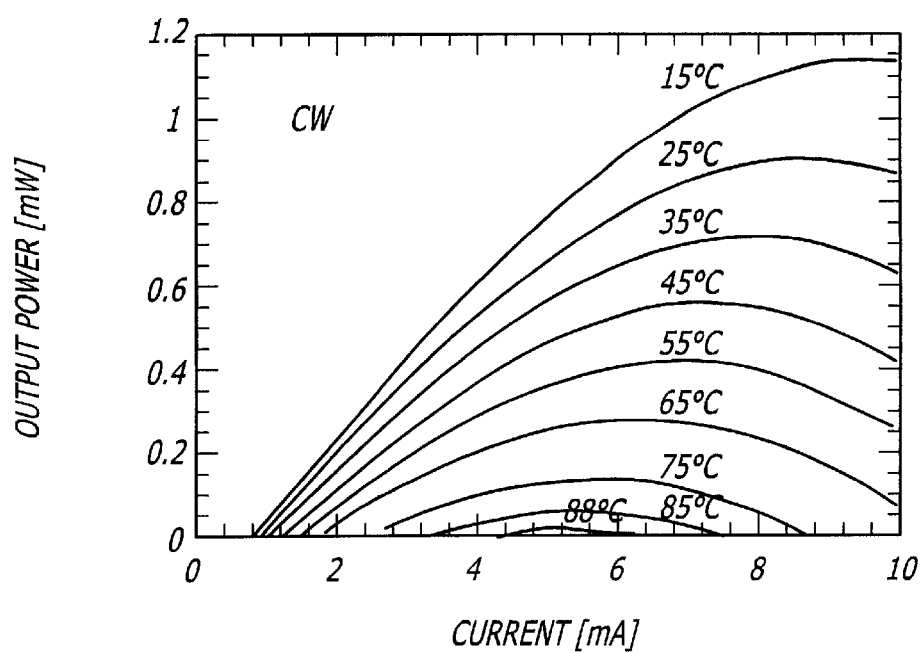
FIG. 8 is a plot of continuous wave light characteristics of a double intracavity contacted VCSEL with 16 $\mu$m pillar and 8 $\mu$m aperture.
Figure 9:
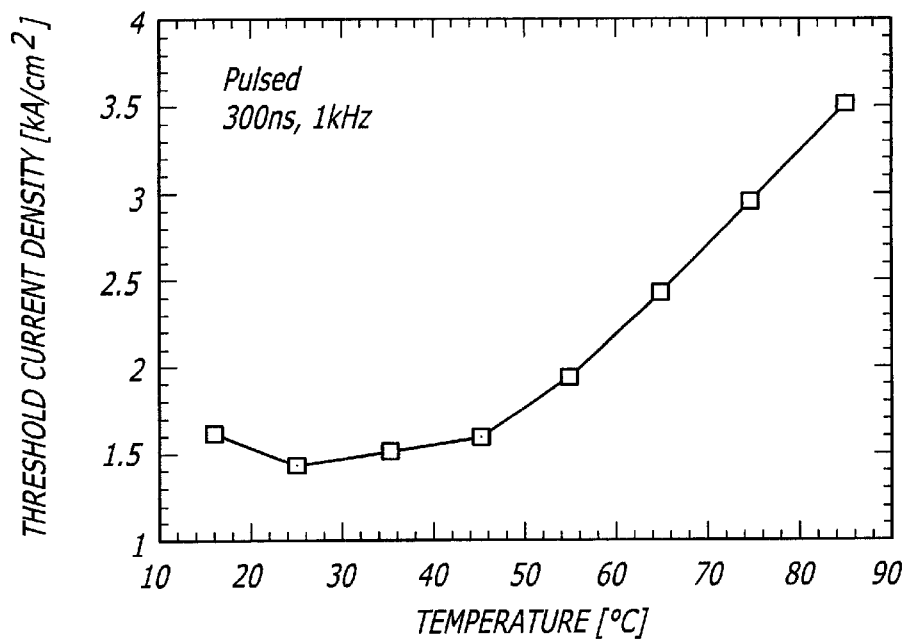
FIG. 9 is a plot threshold current density vs. temperature of a double intracavity contacted VCSEL for pulsed operation.
Figure 10:
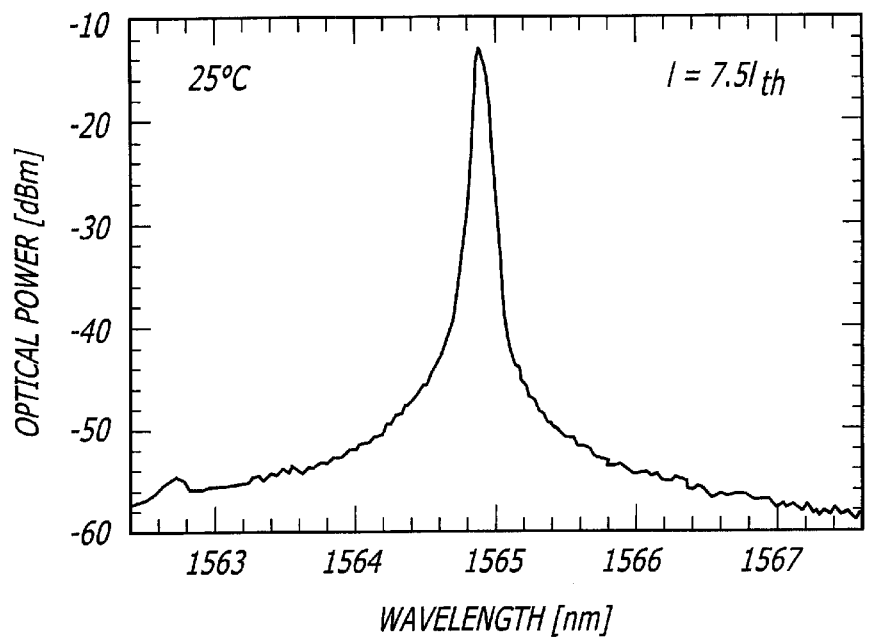
FIG. 10 is a plot of lasing spectrum at 7.5 times threshold for a double intracavity contacted VCSEL.

FIG. 8 is a plot of the L-I characteristics of the VCSEL 10 with a 16 $\mu$m etched pillar and an 8 $\mu$m undercut aperture, measured at various temperatures under both continuous wave and pulsed operation. At 25° C., the threshold current and threshold density are 800 $\mu$A and 1.6 kA/cm$^2$, respectively, and the differential quantum efficiency is 23% at maximum. The maximum continuous wave output power is 1.05 mW at 20° C. and 110 $\mu$W at 88° C., and the VCSEL 10 operates up to 88° C. FIG. 9 is a plot of the threshold current density under pulsed operation as a function of temperature. The threshold current density is minimized at about 25° C., indicating that the gain peak wavelength matches the cavity mode at this temperature. Larger gain offset will increase the maximum operation temperature as well as the output power at high temperature. The lasing spectrum is also measured. FIG. 10 is a plot of lasing spectrum at 7.5 times threshold for a double intracavity contacted VCSEL 10. A VCSEL 10 with 14 $\mu$m etched pillar and an 8 $\mu$m aperture lases at 1.56 $\mu$m and shows a single-mode operation up to its maximum output, and the side-mode suppression ration is 39 dB. From FIG. 10, it is seen that the smaller pillar adds some level of mode selective loss.

These excellent results, such as high temperature operation and high output power, are attributed to three primary benefits resulting from the VCSEL structure of the present invention: low operating voltage, low thermal impedance, and low scattering loss.

Figure 11A:
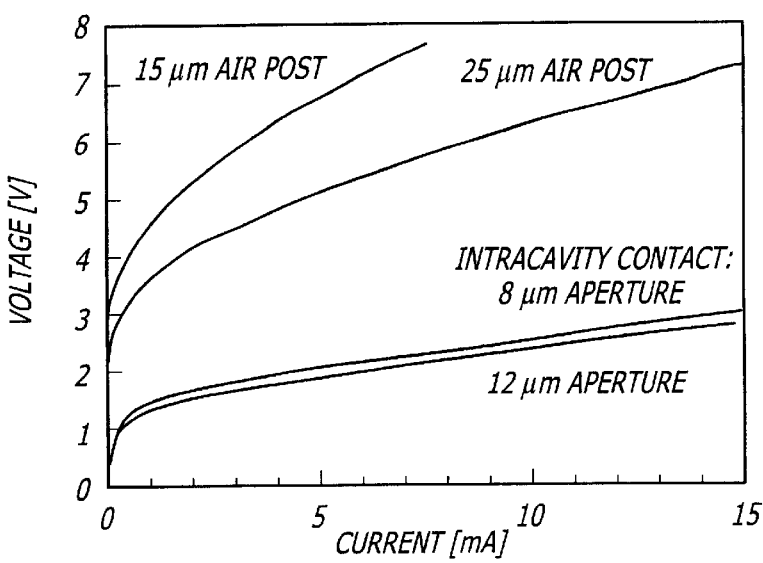
FIG. 11($a$) is a plot of operating voltage for a double intracavity contacted VCSEL with 8 $\mu$m or 12 $\mu$m aperture.
Figure 11B:
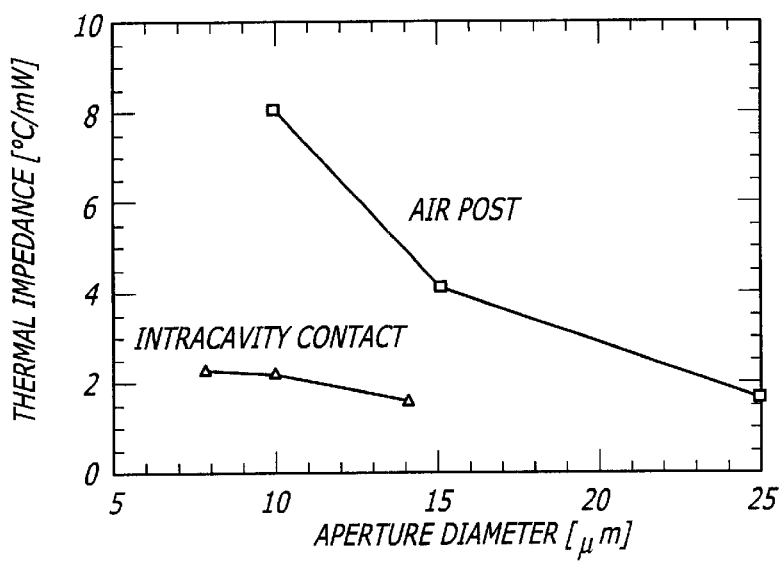
Figure 12:
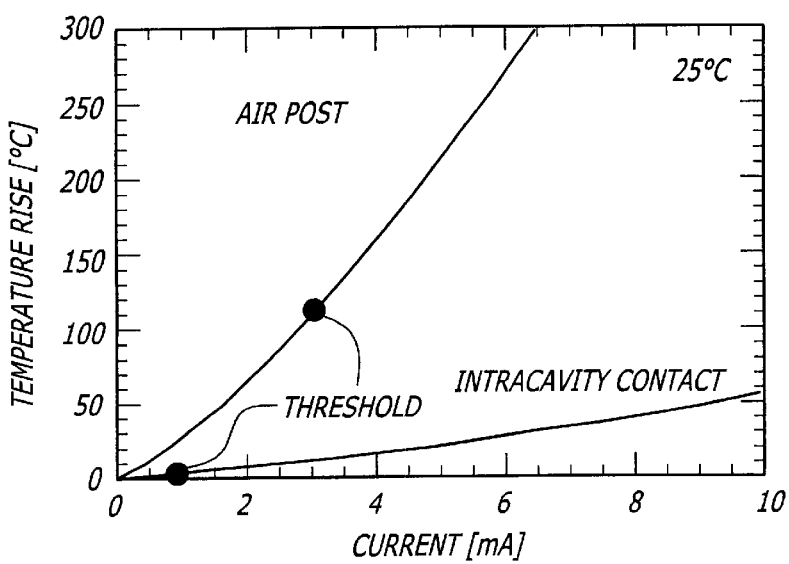
FIG. 12 is a plot of temperature rise in a double intracavity contacted VCSEL with 16 $\mu$m pillar and 8 $\mu$m aperture and a plot of temperature rise in air-post VCSELs (where current is injected through DBRs)

Low values of operating voltage and thermal impedance result from the double intracavity-contacted structure with the thick, n-type InP layers. FIGS. 11(a) and 11(b) show graphical representations of additional benefits of using InP cladding layers in VCSEL design. FIG. 11(a) is a plot of operating voltage for a double intracavity contacted VCSEL showing injected current vs. voltage characteristics for different aperture diameters. FIG. 11(b) is a plot of the thermal impedance as a function of aperture diameter. Both figures also show the data for air-post VCSELs, in which current is injected through the Sb-based DBRs. The double intracavity contacted design provides much lower electrical and thermal impedance when compared with air-post VCSELs. FIG. 12 is a plot of temperature rise in a double intracavity contacted VCSEL with 16 $\mu$m pillar and 8 $\mu$m aperture and a plot of temperature rise in air-post VCSELs. The double intracavity-contacted VCSEL with a 16 $\mu$m pillar and an 8 $\mu$m aperture shows a threshold voltage of 1.4V and thermal impedance of 2.2° C./mW, whereas the 15 $\mu$m air-post VCSEL shows a threshold voltage of 7.0V and a thermal impedance of 4.1° C./mw. These differences indicate that in the double intracavity-contacted structure both the injected current and generated heat bypass the AlAsSb/AlGaAsSb DBRs, which have poor thermal and electrical conductivity. These low values eventually decrease the device temperature, resulting in good thermal properties of the VCSELs. The temperature rise in the InP intracavity VCSEL is less than 10° C. at threshold, which is much lower than the air-post VCSELs (>100° C.), even though the aperture, which corresponds to a cross section of current and heat paths, is smaller for the intracavity VCSEL (8 $\mu$m) than for the air-post (15 $\mu$m).

Moreover, the voltage and thermal impedance do not change much with the aperture diameter in the double intracavity-contacted structures as can be seen in the air-post structure, and hence the aperture can be made smaller with little increase in the device temperature. Since a vertical flow of the heat or current in the VCSEL depends on the cross section of the aperture, less dependence of the voltage and thermal impedance on the aperture size shows that in the intracavity-contacted VCSELs the InP cladding layers work as current and heat spreaders and a lateral flow in the InP cladding layers is dominant for both the injected current and generated heat.

Figure 13A:
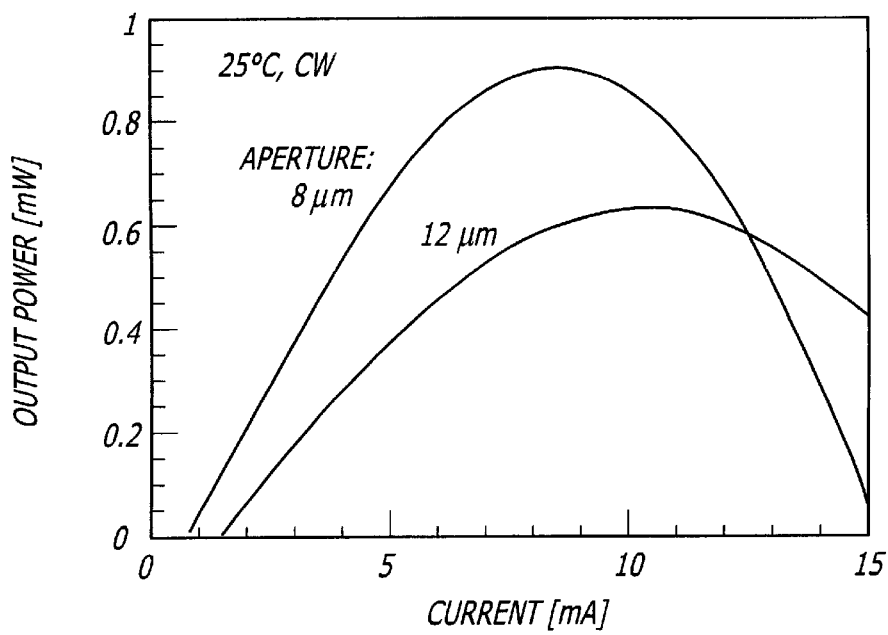
FIG. 13($a$) is a plot of light output characteristics of a double intracavity contacted VCSEL with 16 $\mu$m pillar and 8 $\mu$m or 12 $\mu$m aperture.
Figure 13B:
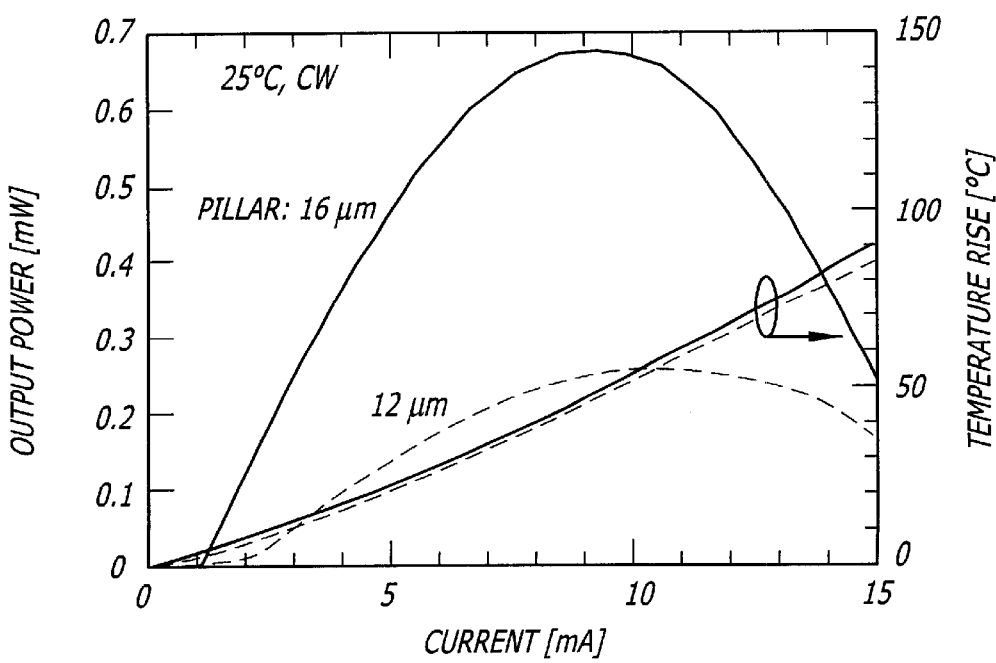

Another benefit, low scattering loss, is introduced into the VCSEL 10 by the undercut aperture 30. FIG. 13(a) is a plot of light output characteristics of a double intracavity contacted VCSEL with 16 μm pillar and 8 μm or 12 μm aperture. The VCSEL 10 with the smaller aperture shows not only a lower threshold current, but also a lower threshold current density, a larger differential quantum efficiency and higher output power. In FIG. 13(b), the L–I characteristics are compared between the two VCSELs with the same 10 μm aperture diameter and different pillar diameters. The larger pillar corresponds to the deeper undercut. The temperature rise estimated using the measured thermal impedance and dissipated power is also shown. Since the device temperature is almost the same for both VCSELs, they must experience almost the same free-carrier absorption and the same injection efficiency, both of which strongly depends on the device temperature. Despite this fact, the VCSEL with the larger pillar, i.e. the deeper undercut, shows better performance in the L–I characteristics. By increasing the undercut from 1 μm (12 μm pillar) to 3 μm (16 m pillar), the differential quantum efficiency was increased from 7.2% to 17.5%, and the maximum lasing temperature was increased from 55° C. to 75° C. The deeper undercut reduces more scattering loss at the sidewall of the etched pillar and provides the better L–I characteristics.

Figure 14:
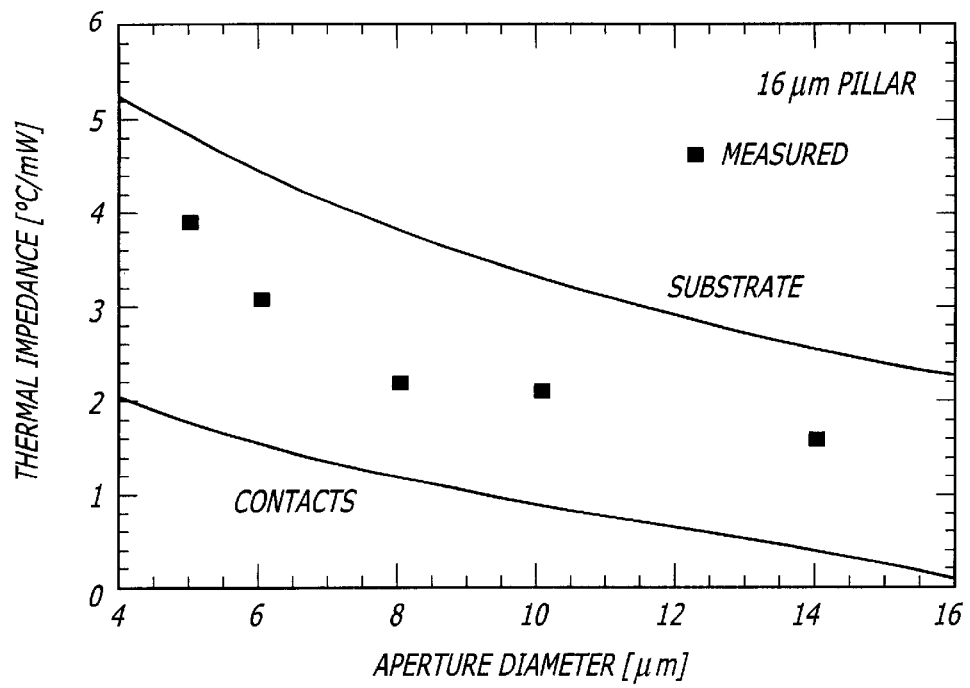
FIG. 14 is graphical representation showing the reduction in thermal impedance in a VCSEL with flip-chip bonding.

Even with the use of the two InP cladding layers 12a, 12b, however, a large amount of heat generated by the active region 14 during performance of the VCSEL dissipates through the second mirror portion 20 instead of through the contacts 22 placed near the active region 14. In one embodiment, a method of heat sinking the VCSEL known as flip-chip bonding is used to provide high heat conductivity through a heat sinking substrate. FIG. 14 is graphical representation showing the reduction in thermal impedance in a VCSEL with flip-chip bonding. In FIG. 14, the substrate 32 is still one of the dominant heat paths, but by heat sinking to the substrate 32, the thermal impedance of the contacts is reduced from measured value of 2.2° C./mW to 1.2° C./mW for a 8 μm aperture. In this embodiment, a metal contact design such as gold-to-gold (Au-to-Au) bonding prevents the increase of thermal impedance due to the bonding of the contacts 22 to the active region 14. Substantial improvement in the thermal impedance results when the VCSEL is flip-chip bonded directly to a heat-sinking substrate with a series of bumps, which may be made of indium phosphide. Heat generated in the active region is conducted to the heat-sink through the InP layers in the bumps, which have a very high thermal conductivity.

Figure 15:
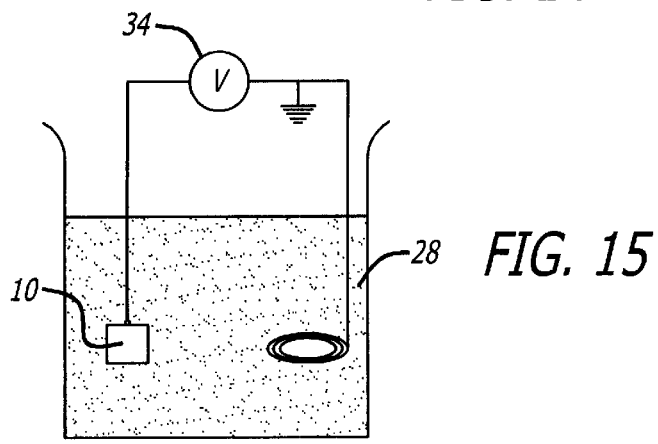
FIG. 15 is a schematic representation of the application of a 5V DC power supply to a VCSEL in a solution of citric peroxide.

In another embodiment, the VCSEL 10 is etched after all other processing has been completed, including the placement of contacts 22. This is done in order to take advantage of the high selectivity of the citric acid-hydrogen peroxide mixture in the etching of the active region. However, the etch rates of this citric acid-hydrogen peroxide mixture are dramatically affected when contacts are in place, slowing the undercut to 40% of the rate without contacts and therefore slowing the processing rate. Such effects are commonly seen in metal-semiconductor systems since the metal can change the potential of the semiconductor material with respect to the etching solution. FIG. 15 shows one way to overcome these effects by biasing the VCSEL 10 with respect to the solution. In FIG. 15, VCSEL structures with contacts 22 are coupled to a DC power supply 34 and are placed in a citric acid-hydrogen peroxide mixture. When a +5V bias is applied to the VCSEL 10, undercut etching of the InAlGaAs material is decreased. Additionally, the etching of the other n-type material is promoted. The etching rate of the heavily-doped n-type InP is as large as the etching rate of the InAlGaAs. By applying a −5V bias, however, the etching rate of the InAlGaAs not only returns to pre-metal levels but actually is slightly faster.

Figure 16:
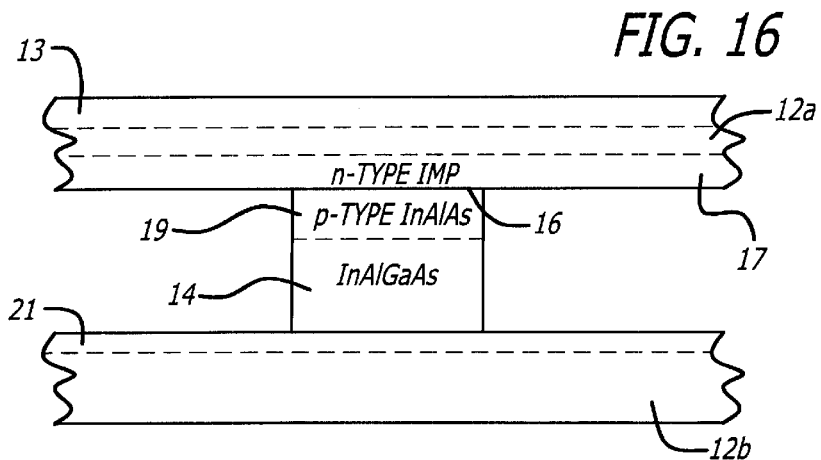
FIG. 16 is a diagrammatic view of a portion of a VCSEL illustrating a tunnel junction and contact layers.

Returning to describe the tunnel junction 16 in more detail with reference to FIG. 16, the tunnel junction 16 is partly formed in the InP cladding layer 12a and partly in the InAlGaAs active region 14. The portion formed in the InP cladding layer 12a can be designated as the n-type tunnel junction portion 17 and the portion formed in the InAlGaAS active region 14 can be designated as the p-type tunnel junction portion 19. The InP cladding layers 12a, 12b are Si n-type doped to a level of $5 \times 10^{17}$ cm$^{-3}$. The cladding layers 12a, 12b have a heavily-doped contact layers 13, 21 at their upper surfaces. The contact layers 13, 21 can, in one embodiment, be less than 100 Å thick and can be doped with Si to a density of $5 \times 10^{18}$ cm$^{-3}$. The n-type tunnel junction portion 17 can, in one embodiment, be less than 200 Å thick, and in particular can be less than 100 Å thick, and can be doped with Si to a density of $5 \times 10^{18}$ cm$^{-3}$. Thus, the cladding layer 12a has a doping profile having increased doping levels at each surface. The p-type tunnel junction portion 19 can be less than 200 Å thick, and preferably less than 100 Å thick, and can be composed of InAlAs doped to a level of $1 \times 10^{20}$ cm$^{-3}$. The InAlAs can be doped with acceptors such as Carbon, or CBr4, for example.

The mixture of citric acid and hydrogen peroxide selectively etches away the p-type InAlAs tunnel junction portion 19 along with the InAlGaAs active region 14, but leaves the n-type InP tunnel junction portion 17 substantially in place. This remaining n-type InP tunnel junction portion 17 can be desirable because it provides additional lateral conductivity from the laterally offset contacts 22 to the active region 14.

Figure 17:
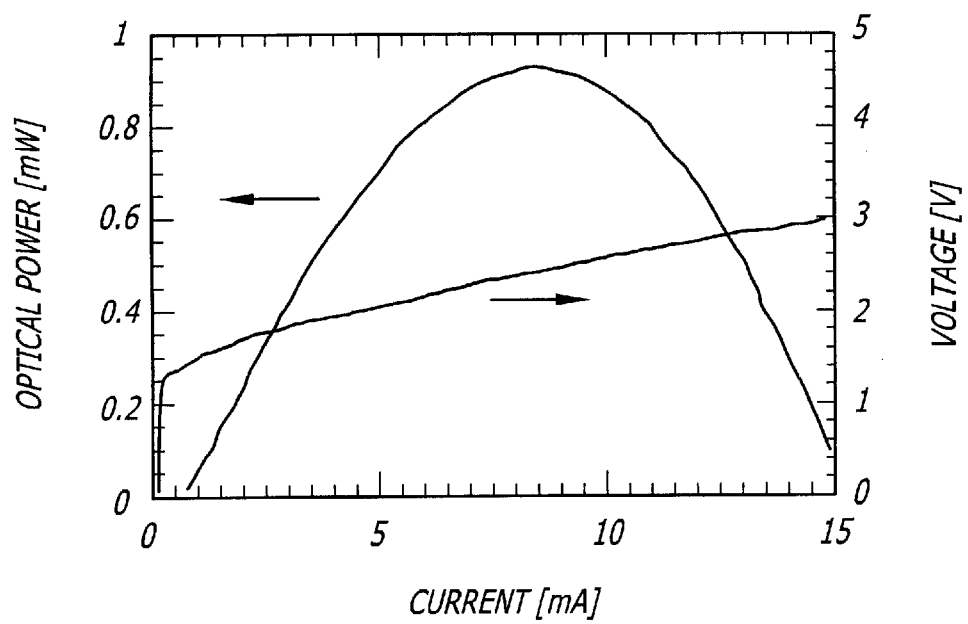
FIG. 17 graphically illustrates optical output power and voltage as a function of current through the VCSEL.
Figure 18:
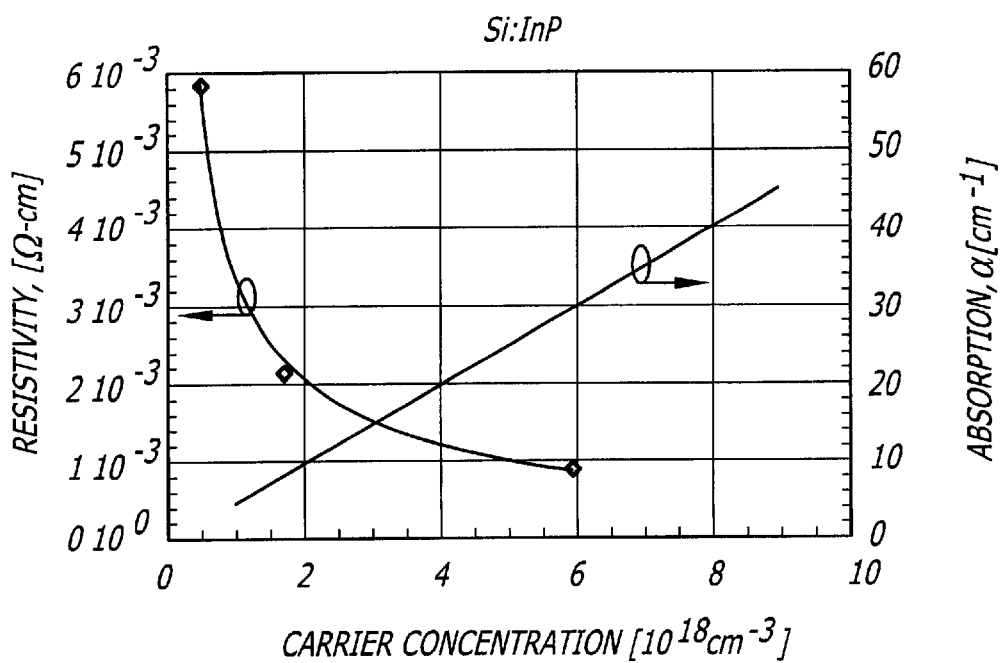
FIG. 18 graphically illustrates resistivity and optical loss as a function of doping level for the Silicon doped InP.

The tunnel junction 16 allows for the use of n-doped cladding layers 12a, 12b. This results in reduced electrical resistance and reduced free carrier optical absorption than in p-type layers having the same doping level. A VCSEL with n-type cladding layers 12a, 12b enabled by the tunnel junction 16 achieves low dissipated power and high differential efficiency simultaneously, resulting in higher power efficiency. The tunnel junction 16 converts the electrons to holes just in time for the active region. In the double intracavity-contacted VCSEL 10 of FIG. 1, where electrical contact is made through the cladding layers 12a, 12b, the n-type doping combined with the tunnel junction 16 is particularly beneficial. If one of the cladding layers 12a, 12b were a p-type cladding layer then much of the reduction in optical loss from using undoped DBRs would return in the thick p-type cladding layer. Not only is the loss associated with the p-type material greater, but the doping level has to be higher in p-type layers since hole mobility is comparatively low and the layers themselves have to be fairly thick to minimize the electrical resistance. Optical loss in the p-type cladding layers, therefore, is a limiting factor if used in double intracavity-contacted VSCELs. N-type material, on the other hand, has a high electrical conductivity even for low doping levels (and, again, lower loss at those doping levels). The electrical conductivity and optical loss as a function of doping level for the Silicon doped InP, for example, are shown in FIG. 18. The highly doped n-type tunnel diode portion 17 of the cladding layer 12a is located at a standing-wave null in the laser cavity, minimizing free carrier absorption that would diminish the advantages of the overall low level doping of the cladding layer 12a. Despite the low doping of the contact layers, the voltage of the VCSEL 10 is very low as shown in FIG. 17. This low doping level also decreases the loss in the structure, enabling high efficiencies also seen in FIG. 17.

Figure 21:
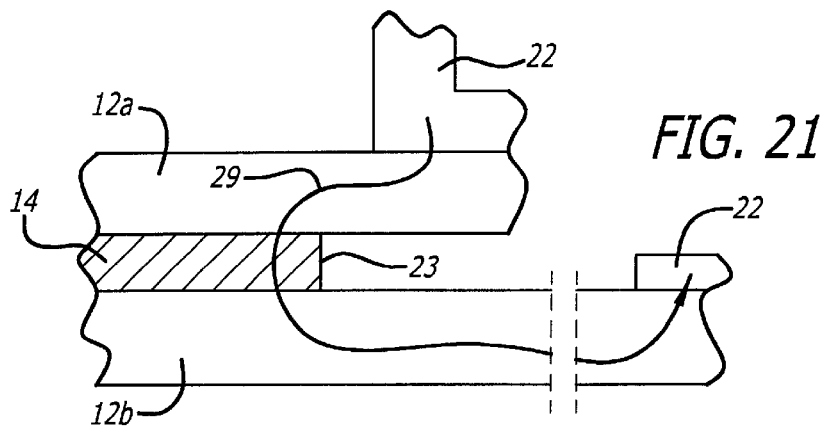
FIG. 21 illustrates the injected current path crowded at the edges of the aperture.

The tunnel junction 16 also serves the important function of spreading current across the aperture, or active region 14. In the present embodiment, the aperture is formed in the active region 14 and the layer 19. However, in other embodiments the aperture can be formed at other locations so long as it confines the current and optical mode. The tunnel junction 16 can also be located at positions other than between the active region 14 and the cladding layer 12a. For example, the tunnel junction 16 can be formed entirely within the cladding layer 12a. As shown in FIG. 21, without the tunnel junction the injected current path 29 tends to crowd at the edges 23 of the aperture or active region 14. This is because the current tries to follow the path of least resistance. Thus little of the current passes through the center of the active region 14. This concentrates light generation around the periphery of the device and increases the loss associated with sidewall scattering. It also limits the number of carriers overlapping the fundamental mode of the waveguide. The finite resistance of the quantum well diodes causes some of the carriers to spread but is not large enough to prevent significant crowding. The low, but finite resistance of the tunnel junction 16 of FIGS. 1 and 16 provides a relatively constant potential plane across the entire horizontal cross-section of the aperture or active region 14 to spread the current across the entire aperture. This provides current leveling across the entire aperture.

Figure 19:
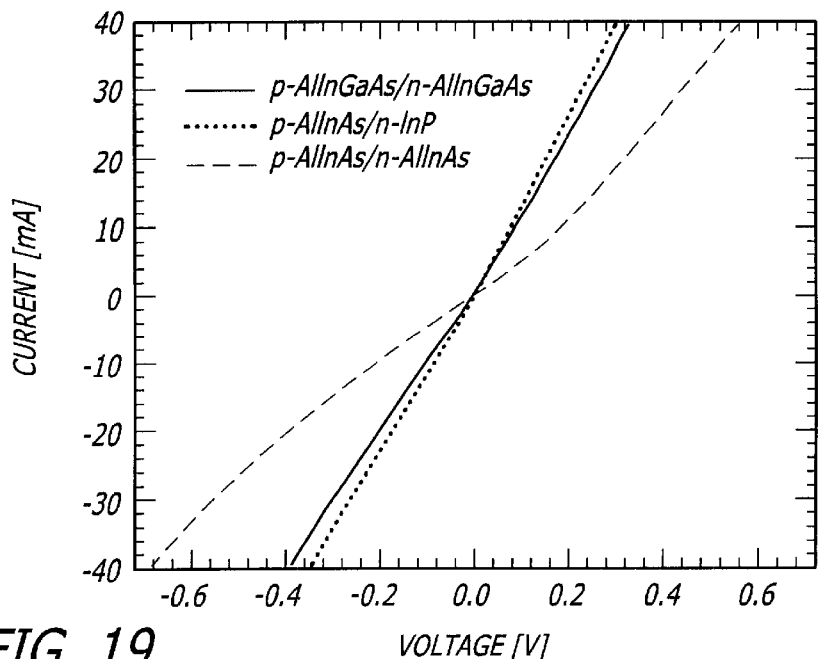
FIG. 19 illustrates I–V plots for three different types of tunnel junctions.

FIG. 19 shows I–V plots for three different types of tunnel junctions, including the n-type InP/p-type InAlAs junction described above. The resistivity of these layers is significant compared to the resistivity of one of the cladding layer 12a. Indium phosphide, one of the materials which is suitable for forming the cladding layer 12a, has a resistivity of $5.8 \times 10^{-3}$ ohm-cm for a doping level of only $5 \times 10^{17}$ cm$^{-3}$. Since these tunnel junctions can be made with InAlAs, its derivatives, and InP, they can be etched or oxidized and serve as the aperture layer and also provide a built-in current leveling layer for the aperture.

Figure 20:
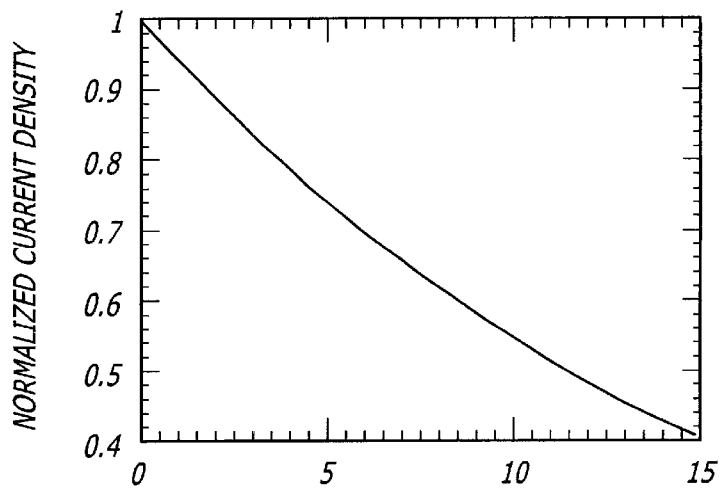
FIG. 20 provides an estimate of the current density versus distance dependence which is derived for an InP current spreading layer with an InP/InAlAs tunnel junction.

FIG. 20 provides an estimate of the current density versus distance dependence which is derived for an InP current spreading layer with an InP/InAlAs tunnel junction and the aperture in the same layer as the tunnel junction. The calculation is based on a simple resistor network. The plot of FIG. 20 starts at the edge 23 of FIG. 21 at "0 μm" and moves towards the center of the aperture disk formed by the active region 14 at "15 μm". The disk in this example thus has a diameter of 30 μm. The current remains greater at the edge 23 than at the center of the disk formed by the active region 14, however, the current leveling effect is still significant compared to a device without the tunnel junction and is enough to allow practical intracavity devices. The current density in this example only varies by approximately 60% from the center of the aperture to the edge of the aperture.

It is to be understood that other embodiments may be utilized and structural and functional changes may be made without departing from the scope of the present invention. The foregoing descriptions of embodiments of the invention have been presented for the purposes of illustration and description. It is not intended to be exhaustive or to limit the invention to the precise forms disclosed. Accordingly, many modifications and variations are possible in light of the above teachings. For example, may different sizes of apertures can be used when selectively etching an active region. Also, different amounts of materials used in the design of the various VCSEL components can be used depending on design requirements. Furthermore, the VCSEL may be etched from the substrate up through the bottom mirror portion and bottom cladding layer. It is therefore intended that the scope of the invention be limited not by this detailed description.

What is claimed is:

1. A method of forming a vertical cavity surface emitting laser, the method comprising:

providing a doable intracavity contacted structure including a first mirror portion, a first InP cladding layer, a second InP cladding layer, an active region disposed between the first and second cladding layers, and a second mirror portion;

applying a first selective etch to remove at least a portion of the first mirror portion and to expose the first cladding layer wherein the first selective etch stops at the top of the first cladding layer, said first selective etch including a first reactive ion etch;

applying a second selective etch to remove at least a portion of the first cladding layer and to expose the active region, said second selective etch including a second reactive ion etch;

applying a third selective etch to remove at least a portion of the active region to expose the second cladding layer; and wherein the third selective etch removes at least a portion of the active region only, and not the first or the second cladding layers.

2. The method of claim 1, wherein the first etch removes at least a portion of the first mirror portion and exposes the first cladding layer while leaving a first highly doped contact layer at the surface of the first cladding layer substantially in place.

3. The method of claim 2, wherein the third etch removes at least a portion of the active region and exposes the second cladding layer while leaving a second highly doped contact layer at the surface of the second cladding layer substantially in place.

4. The method of claim 1, wherein the first and second cladding layers are heavily doped layers of indium phosphide.

5. The method of claim 4, wherein the first and second mirror portions include the elements aluminum, arsenic, and antimonide.

6. The method of claim 5, wherein the first and second mirror portions also include the element gallium.

7. The method of claim 1, wherein the active region includes the elements indium, phosphorus, aluminum, and gallium.

8. The method of claim 7, wherein the active region also includes the element arsenic.

9. The method of claim 1, wherein the first selective etch is a reactive ion etch utilizing chlorine to remove the first mirror portion.

10. The method of claim 8, wherein the first selective etch has a selectivity of 6:1.

11. The method of claim 1, wherein the second selective etch is a reactive ion etch utilizing methane and hydrogen gases to remove at least a portion of the first cladding layer.

12. The method of claim 11, wherein the second selective etch also includes argon gas.

13. The method of claim 1, wherein the second selective etch stops at the top of the active region after removing the tat cladding layer.

14. The method of claim 1, wherein the second selective etch bas a selectivity of 16:1.

15. The method of claim 1, wherein the third selective etch includes a mixture of citric acid and hydrogen peroxide.

16. The method of claim 15, wherein the third selective etch stops at to top of the second cladding layer after removing at least a portion of the active region.

17. The method of claim 1, wherein the third selective etch has a selectivity of 80:1.

18. The method of claim 1, further comprising biasing the double intracavity contacted structure with a positive voltage power supply to increase rate of etching of the active region.

19. The method of claim 1, further comprising biasing the double intracavity contacted structure with a negative voltage power supply to increase rate of etching of the active region.

20. The method of claim 1, wherein applying the third selective etch includes placement of the double intracavity contacted structure in a mixture of citric acid and hydrogen peroxide.

21. The method of claim 20, wherein a positive voltage power supply is applied to the double intracavity contacted structure while the structure is placed in said mixture to increase rate of etching of the active region.

22. The method of claim 20, wherein a negative voltage power supply is applied to the double intracavity contacted structure while the structure is placed in said mixture to increase rate of etching of the active region.

23. The method of claim 1, wherein at least a portion of the active region is removed to form an undercut aperture between the first and second mirror portions.

24. The method of claim 23, wherein the undercut aperture is formed using a citric peroxide selective etch.

25. The method of claim 23, wherein the undercut aperture is formed by introducing n insulating oxide layer into the active region.

26. The method of claim 1, wherein the first and second mirror portions are multi-layer materials including the elements aluminum, arsenic, and antimonide.

27. The method of claim 1, wherein the first selective etch includes chlorine.

28. The method of claim 1, wherein the first selective etch stops at the top of the first cladding layer after removing the first mirror portion from the device.

29. The method of claim 1, wherein the second selective etch includes methane and hydrogen.

30. The method of claim 29, wherein the second selective etch further includes argon.

31. The method of claim 1, wherein the second selective etch stops at the top of the active region after removing the first cladding layer from the device.

32. The method of claim 24, wherein the citric peroxide selective etch stops at the top of the second InP cladding layer after removing at least a portion of the active region from the device.

33. The method of claim 24 wherein the citric peroxide selective etch has a selectivity of 80:1.

34. A method of forming a vertical cavity surface emitting laser, the method comprising:
 providing a double intra cavity contacted structure including a first minor portion, a first cladding layer, a second cladding layer, an active region disposed between the first and second cladding layers, and a second mirror portion;
 applying a first selective etch to remove at least a portion of the first minor portion and to expose the first cladding layer, said first selective etch having a selectivity of at least about 6:1;
 applying a second selective etch to remove at least a portion of the first cladding layer and to expose the active region, said second selective etch having a selectivity of at least about 16:1; and
 applying a third selective etch to remove at least a portion of the active region to expose the second cladding layer, said third selective etch having a selectivity of at least about 80:1.

35. A method of manufacturing a vertical cavity surface emitting laser, the method comprising:
 providing a double intracavity contacted structure including a first mirror portion, a first cladding layer, a second cladding layer, an active region disposed between the first and second cladding layers, and a second mirror portion;
 applying a first selective etch to remove at least a portion of the first mirror portion and to expose the first cladding layer, said first selective etch having a selectivity of at least about 6:1;
 applying a second selective etch to remove at least a portion of the first cladding layer and to expose the active region, said second selective etch having a selectivity of at least about 16:1; and
 applying a third selective etch to remove at least a portion of the active region to expose the second cladding layer.

36. A method of manufacturing a vertical cavity surface emitting laser, the method comprising
 providing a double intra cavity contacted structure including a first mirror portion, a first cladding layer, a second cladding layer, an active region disposed between the first and second cladding layers, and a second mirror portion;
 applying a first selective etch to remove at least a portion of the first mirror portion and to expose the first cladding layer, said first selective etch having a selectivity of at least about 6:1;
 applying a second selective etch to remove at least a portion of the first cladding layer and to expose the active region; and
 applying a third selective etch to remove at least a portion of the active region to expose the second cladding layer, said third selective etch having a selectivity of at least about 80:1.

37. A method of manufacturing a vertical cavity surface emitting laser, the method comprising:
 providing a double intracavity contacted structure including a first minor portion, a first cladding layer, a second cladding layer, an active region disposed between the first and second cladding layers, and a second mirror portion;
 applying a first selective etch to remove at least a portion of the first mirror portion and to expose the first cladding layer;
 applying a second selective etch to remove at least a portion of the first cladding layer and to expose the active region, said second selective etch having a selectivity of at least about 16:1; and
 applying a third selective etch to remove at least a portion of the active region to expose the second cladding layer, said third selective etch having a selectivity of at least about 80:1.

38. A method of manufacturing a vertical cavity surface emitting laser, the method comprising:
 providing a double intracavity contacted structure including a first mirror portion, a first cladding layer, a second cladding layer, an active region disposed between the first and second cladding layers, and a second minor portion;

applying a first selective etch to remove at least a portion of the first mirror portion and to expose the first cladding layer, the first selective etch being a reactive ion etch including chlorine;

applying a second selective etch to remove at least a portion of the first cladding layer and to expose the active region, the second selective etch being a reactive ion etch including methane and hydrogen; and applying a third selective etch to remove at least a portion of the active region to expose the second cladding layer, the third selective etch including citric acid and hydrogen peroxide.

39. A method of manufacturing a vertical cavity surface emitting laser, the method comprising:

providing a double intracavity contacted structure including a first minor portion, a first cladding layer, a second cladding layer, an active region disposed between the first and second cladding layers, and a second mirror portion;

applying a first selective etch to remove at least a portion of the first mirror portion and to expose the first cladding layer;

applying a second selective etch to remove at least a portion of the first cladding layer and to expose the active region;

applying a third selective etch to remove a portion of the active region to expose the second cladding layer; and biasing the double intracavity contacted structure with a negative voltage power supply to increase raze of etching of the active region.

40. A method of manufacturing a vertical cavity surface emitting laser, the method comprising:

providing a double intracavity contacted structure including a first mirror portion, a first cladding layer, a second cladding layer, an active region disposed between the first and second cladding layers, and a second minor portion;

said first mirror portion and said second mirror portion including $Al_xGa_{1-x}As_ySb_{1-y}$ material;

said active region including InAlGaAs material;

said first and second cladding layers including InP material;

applying a first selective etch to remove at least a portion of the first mirror portion and to expose the first cladding layer, the first selective etch being a reactive ion etch including chlorine;

applying a second selective etch to remove at least a portion of the first cladding layer and to expose the active region, the second selective etch being a reactive ion etch including methane and hydrogen; and applying a third selective etch to remove a portion of the active region to expose the second cladding layer, the third selective etch including citric acid and hydrogen peroxide.

41. The method according to claim 40, wherein said first mirror portion and said second mirror portion further includes $AlAs_zSb_{1-z}$.

42. The method according to claim 40, wherein x is between 0 and 1.

43. The method according to claim 40, wherein y is between 0 and 1.

44. The method according to claim 41, wherein z is between 0 and 1.

45. A method of manufacturing a vertical cavity surface emitting laser, the method comprising:

providing a double intracavity contacted structure including a first mirror portion, a first cladding layer, a second cladding layer, an active region disposed between the first and second cladding layers, and a second minor portion;

said first minor portion and said second mirror portion including $Al_xGa_{1-x}As_ySb_{1-y}$ material;

said active region including InAlGaAs material;

said first and second cladding layers including InP material;

applying a first selective etch to remove at least a portion of the first mirror portion and to expose the first cladding layer, the first selective etch being a reactive ion etch including chlorine and having a selectivity of at least about 6:1;

applying a second selective etch to remove at least a portion of the first cladding layer and to expose the active region, the second selective etch being a reactive ion etch including methane and hydrogen and having a selectivity of at least about 16:1; and applying a third selective etch to remove at least a portion of the active region to expose the second cladding layer, the third selective etch including citric acid and hydrogen peroxide and having a selectivity of at least about 80:1.

46. The method according to claim 45, wherein said first mirror portion and said second mirror portion further includes $AlAs_zSb_{1-z}$.

47. The method according to claim 45, wherein x is between 0 and 1.

48. The method according to claim 46, wherein y is between 0 and 1.

49. The method according to claim 46, wherein z is between 0 and 1.

50. A method of forming a vertical cavity surface emitting laser, the method comprising:

providing a double intracavity contacted structure including a first minor portion, a first cladding layer, a second cladding layer, an active region disposed between the first and second cladding layers, and a second mirror portion;

applying a first selective etch to remove at least a portion of the first mirror portion and to expose the first cladding layer;

applying a second selective etch to remove at least a portion of the first cladding layer and to expose the active region; and applying a third selective etch to remove at least a portion of the active region and to expose the second cladding layer wherein the third selective etch stops at the top of the second cladding layer.

51. The method of claim 50, wherein the first etch removes at least a portion of the first minor portion and exposes the first cladding layer while leaving a first highly doped contact layer at the surface of the first cladding layer substantially in place.

52. The method of claim 50, wherein the third etch removes at least a portion of the active region and exposes the second cladding layer while leaving a second highly doped contact layer at the surface of the second cladding layer substantially in place.

53. The method of claim 50, wherein the first selective etch is a reactive ion etch utilizing chlorine to remove the first mirror portion.

54. The method of claim 50, wherein the second selective etch is a reactive ion etch utilizing methane and hydrogen gases to remove at least a portion of the first cladding layer.

55. The method of claim 50, wherein the third selective etch includes a mixture of citric acid and hydrogen peroxide.

* * * * *